United States Patent [19]

Osawa et al.

[11] Patent Number: 5,250,446
[45] Date of Patent: Oct. 5, 1993

[54] METHOD OF MANUFACTURING A SEMICONDUCTOR DEVICE BY FORMING AT LEAST THREE REGIONS OF DIFFERENT LIFETIMES OF CARRIERS AT DIFFERENT DEPTHS

[75] Inventors: Akihiko Osawa, Tokyo; Yoshiro Baba, Yokohama; Mitsuhiko Kitagawa, Tokyo; Tetsujiro Tsunoda, Fujisawa, all of Japan

[73] Assignee: Kabushiki Kaisha Toshiba, Kawasaki, Japan

[21] Appl. No.: 959,465

[22] Filed: Oct. 9, 1992

Related U.S. Application Data

[60] Division of Ser. No. 865,626, Apr. 4, 1992, abandoned, which is a continuation of Ser. No. 636,284, Dec. 31, 1990, abandoned.

[30] Foreign Application Priority Data

Jan. 11, 1990 [JP] Japan ........................... 2-3870

[51] Int. Cl.$^5$ ........................... H01L 21/265
[52] U.S. Cl. ........................... 437/24; 437/11; 437/933; 148/DIG. 128
[58] Field of Search ........... 357/63, 64, 91, 38, 357/234; 437/11, 17, 18, 24, 151, 152, 933, 959; 148/DIG. 40, DIG. 127, DIG. 128, DIG. 151, DIG. 157, DIG. 23

[56] References Cited

U.S. PATENT DOCUMENTS

| | | | |
|---|---|---|---|
| 3,865,633 | 2/1975 | Shannon et al. | 437/11 |
| 4,290,825 | 9/1981 | Dearnaley et al. | 437/933 |
| 4,620,211 | 10/1986 | Baliga et al. | 357/91 |
| 4,752,818 | 6/1988 | Kushida et al. | 357/38 |
| 4,987,087 | 1/1991 | Voss | 437/24 |

FOREIGN PATENT DOCUMENTS

| | | | |
|---|---|---|---|
| 0110247 | 9/1981 | Japan | 437/24 |
| 0166032 | 7/1986 | Japan | 437/11 |

*Primary Examiner*—Brian E. Hearn
*Assistant Examiner*—C. Chaudhari
*Attorney, Agent, or Firm*—Finnegan, Henderson, Farabow, Garrett & Dunner

[57] ABSTRACT

A mixture of at least two types of charged particles of ions having the same value obtained by dividing the electric charge of an ion by the mass of the ion, i.e., a mixture of charged particles including hydrogen molecular ions $H_2^+$ and deuterium ions $D^+$, is accelerated in a charged particle accelerator. Since the mass spectrograph unit in the accelerator cannot divide the hydrogen molecular ions $H_2^+$ and the deuterium ion $D^+$, both ions are accelerated together. When the hydrogen molecular ion $H_2^+$ collides against a silicon substrate, it is divided into two hydrogen ions $2H^+$. Since the hydrogen ion $H^+$ and the deuterium ion $D^+$ have different ranges in silicon, two regions including a great number of crystal defects are formed in the silicon substrate in one ion irradiating step. As a result, at least three regions of different lifetimes of carriers are formed at different depths of the semiconductor substrate.

4 Claims, 3 Drawing Sheets

METHOD OF MANUFACTURING A SEMICONDUCTOR DEVICE BY FORMING AT LEAST THREE REGIONS OF DIFFERENT LIFETIMES OF CARRIERS AT DIFFERENT DEPTHS

This application is a divisional application of application Ser. No. 07/865,626, filed Apr. 4, 1992, now abandoned, which was a continuation application of application Ser. No. 07/636,284, filed Dec. 31, 1990 now abandoned.

BACKGROUND OF THE INVENTION

1. Field of the Invention

This invention relates to a semiconductor device in which the lifetime of carriers can be controlled in a substrate and to a method of manufacturing the same.

2. Description of the Related Art

A proton irradiation technique is known as a technique of controlling the lifetime of carriers locally by irradiating charged particles. In this technique, protons are injected into a semiconductor substrate, forming a large number of crystal defects in a proton stopping region (in the semiconductor substrate). The crystal defects trap carriers, thus shortening the lifetime of carriers in a limited area of the substrate. The depth of the proton stopping region from a surface of the substrate can be controlled by changing acceleration energy of the protons. As a result, as shown in FIG. 1, a density of crystal defects at a deep level, for example, at a level 0.39 eV lower than a conductive band Ec can be controlled locally. The region I in FIG. 1 is the proton stopping region. Thus, the region I having a large number of the crystal defects can be formed in a desired local area in the substrate.

FIG. 2 is a cross sectional view showing an arrangement of a conventional high speed switching diode. By virtue of the above-mentioned proton irradiation technique, a high speed switching device which can be turned on by a low voltage, for example, can be obtained. As shown in FIG. 2, N-impurities are injected in a high concentration into an N+-silicon layer 31, on which an N−-epitaxial layer 32 of a low concentration is formed. Further, a P+-region 33 of a high concentration is formed on a portion of the surface region of the epitaxial layer 32.

The diode is turned on when a forward voltage is applied thereto, and turned off when a reverse voltage is applied thereto. When the diode is in an OFF state, a depletion region 34 is formed in a region near the PN junction between the regions 32 and 33, as indicated by a dotted line in FIG. 2. Carriers remain in the depletion region 34 at a beginning of an OFF period. Because of the presence of the carriers, the switching operation of the diode is made slow. To prevent this slow operation, the protons are injected by the proton irradiation technique into the region near the PN junction, in which the depletion region 34 is formed, thereby forming a trap region 35 having a great number of the crystal defects. The carriers remaining in the depletion region 34 at the beginning of the OFF period are trapped in the trap region 35. In general, a crystal defect region can be formed in a limited area of the substrate by injecting the protons and therefore a resistance component of the switching device is not influenced substantially by the injection.

As described above, the switching device which can be turned on at high speed by a low voltage can be obtained by forming a great number of crystal defects locally in the substrate at a predetermined depth from the surface of the substrate, thereby controlling the lifetime of carriers. This technique can be applied to various devices having a PN junction, such as transistor, thyristor, and the like.

An acceleration voltage and a dosage of the protons i.e., an amount of the protons irradiating the substrate are given as basic parameters of the technique of controlling the lifetime of the carriers by means of proton irradiation. The proton stopping region in a silicon layer is determined by the acceleration voltage, and the crystal defect density in the proton stopping region is determined by the dosage of the protons. Hence, when the substrate surface is irradiated once by the protons with the fixed acceleration voltage and the dosage, only one crystal defect region I is formed, as shown in FIG. 1. Accordingly, two or more crystal defect regions have to be formed to control the lifetime of carriers in a device that has a number of PN junctions at different depths in the substrate. It is necessary to irradiate the substrate of such device by the protons with various accelerating voltages in the same number of times as that of the crystal defect regions required. However, if the protons are irradiated repeatedly, the manufacturing steps are increased, resulting in high manufacturing cost and low productivity.

SUMMARY OF THE INVENTION

The present invention was made in consideration of the above-mentioned drawbacks, and its objects are to provide a semiconductor device in which a plurality of regions of different lifetimes of carriers can be formed in a substrate without increasing the number of the manufacturing steps, and to provide a method of manufacturing such a semiconductor device.

To achieve the object, the present invention provides the semiconductor device comprises: at least three regions of different lifetimes of carriers formed in a semiconductor substrate by introducing at least two types of charged particles, having substantially the same value e/m obtained by dividing the electric charge by the mass, into the semiconductor substrate.

Furthermore, the present invention provides the method of manufacturing a semiconductor device comprises the steps of: introducing a mixture of at least two kinds of charged particles having substantially the same value e/m obtained by dividing the electric charge of an ion by the mass of the ion into a semiconductor substrate; and forming at least three regions of different lifetimes of carriers in the semiconductor substrate.

A mixture of at least two types of charged particles having the same value e/m, e.g. a mixture of charged particles including hydrogen molecular ions $H_2^+$ and deuterium ions $D^+$, is accelerated in a charged particle accelerator. Since the mass spectrograph unit in the accelerator cannot divide $H_2^+$ ions and $D^+$ ions, both ions are accelerated together. When an $H_2^+$ ion collides against the silicon substrate, it is divided into two hydrogen ions $2H^+$. Since the hydrogen ion $H^+$ and deuterium ion $D^+$ have different ranges in silicon, two regions including a great number of crystal defects are formed in the silicon substrate in one ion irradiating step. As a result, at least three regions of different lifetimes of carriers are formed at different depths in the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the invention will now be described with reference to the accompanying drawings.

Figure 1:
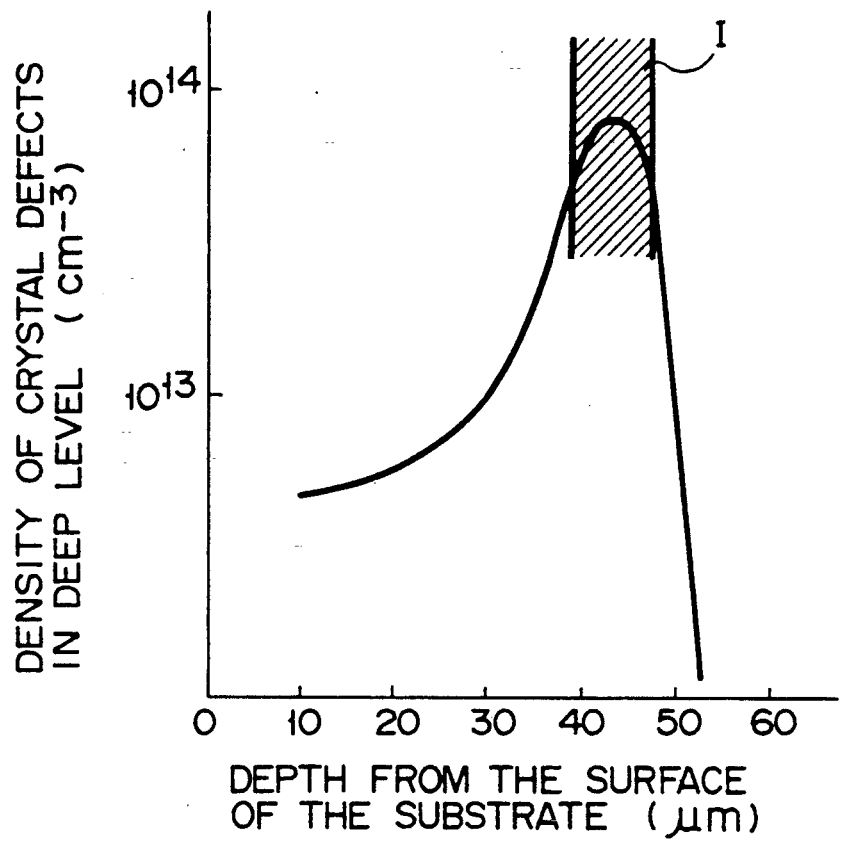
FIG. 1 is a diagram showing a distribution of a crystal defect region formed at a deep level of a semiconductor substrate according to a conventional method of manufacturing a semiconductor device.
Figure 2:
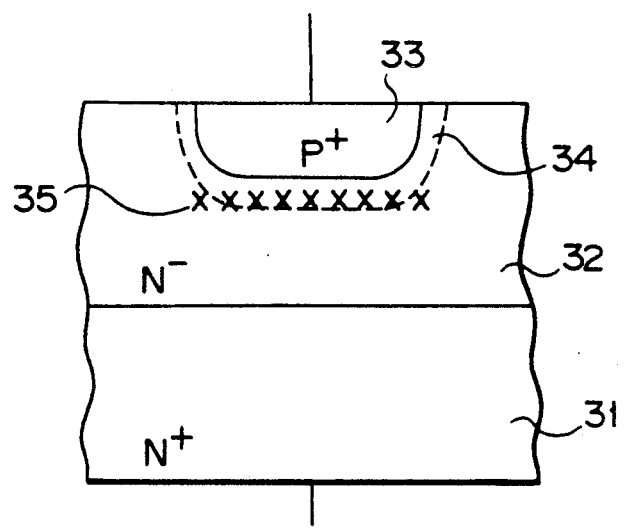
FIG. 2 is a cross sectional view showing an arrangement of a conventional high speed switching diode.
Figure 3:
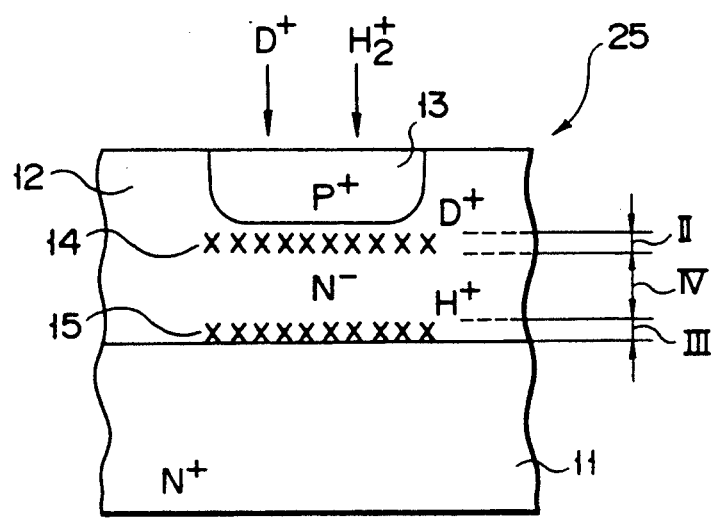
FIG. 3 is a cross sectional view showing an arrangement of an embodiment of a semiconductor device according to the present invention.

FIG. 3 is a cross sectional view showing an arrangement of an embodiment a semiconductor device according to the present invention. The semiconductor device of this embodiment is a high-speed switching diode. A semiconductor substrate 25 is constituted by an $N^+$-silicon layer 11 of a high impurity concentration and an $N^-$-epitaxial layer 12 of a low impurity concentration formed thereon. A $P^+$-region 13 of a high impurity concentration is formed in a portion of the surface region of the epitaxial layer 12. The protons are introduced in the diode to control the lifetime of the carriers. More specifically, a mixture of charged particles of hydrogen molecular ions $H_2^+$ and deuterium ions $D^+$ is irradiated on the substrate 25, as will be described later. The deuterium ions $D^+$ are introduced into a region of the $N^-$-epitaxial layer 12 near the PN junction between the $P^+$-region 13 and the $N^-$-epitaxial layer 12, thereby forming a first crystal defect region 14 including a great number of crystal defects. The hydrogen ions $H^+$ are also introduced into a region at a predetermined depth in the $N^-$-epitaxial layer 12 near the boundary of the $N^+$-silicon substrate 11, thereby forming a second crystal defect region 15. The hydrogen ions $H^+$ pass through the first crystal defect region 14 and form the second crystal defect region 15 in a deep portion of the substrate. According to the present invention, the first and second crystal defect regions 14 and 15 are formed in one ion injection step.

Now, a method of manufacturing a semiconductor device according to the present invention will be described with reference to FIGS. 4 and 5.

Figure 4:
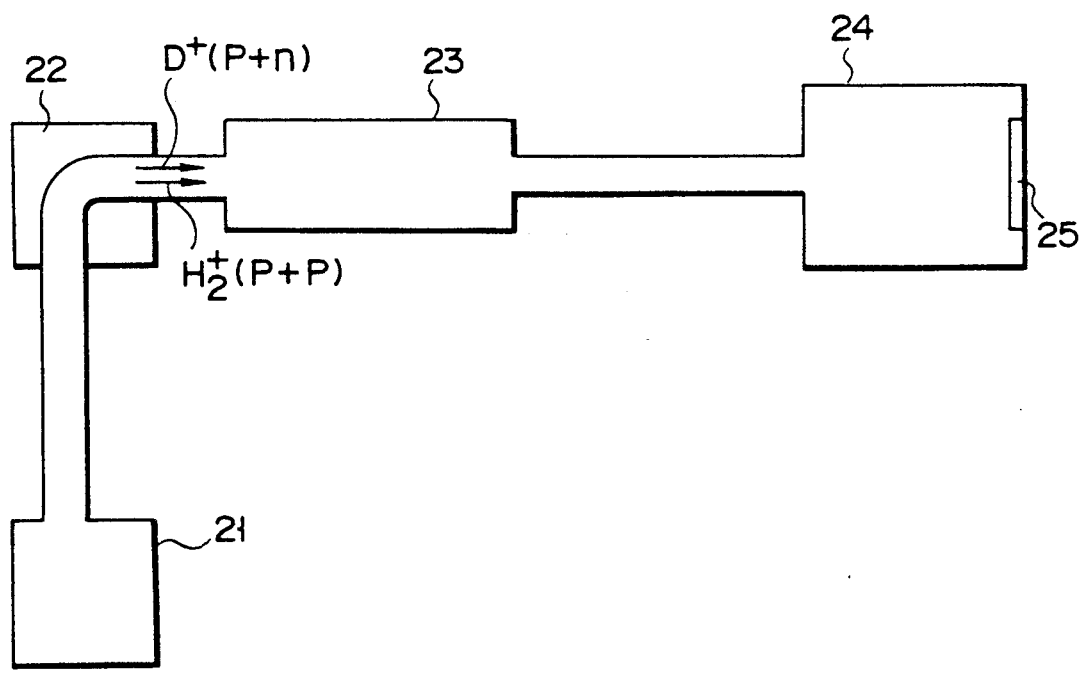
FIG. 4 is a schematic view for explaining a method of manufacturing a semiconductor device according to the present invention.

FIG. 4 shows an arrangement of a charged particle accelerator for use in the present method. The charged particle accelerator in FIG. 4 comprises an ion generating unit 21, a mass spectrograph unit 22, a particle accelerator unit 23, and irradiating unit 24. In the irradiating unit 24, a silicon substrate 25 is disposed so as to face ion beams. The ion generating unit 21 generates a mixture of charged particles of the hydrogen molecular ions $H_2^+$ and the deuterium ions $D^+$. The mass spectrograph unit 22 separates the ions by utilizing the principle that circular orbits of the ions passing through a magnetic field are different depending on the value e/m, where e: the electric charge of an ion, and m: the mass of an ion. The hydrogen molecular ion $H_2^+$ is made up of two protons (p+p) and a deuterium ion $D^+$ is made up of one proton and one deutron (p+n). Hence, the value e/m of the hydrogen ion $H_2^+$ is substantially the same as that of the deuterium ion $D^+$. For this reason, the mass spectrograph unit 22 cannot separate the hydrogen molecular ions $H_2^+$ and the deuterium ions $D^+$ from each other, and both ions are supplied together to the particle accelerator unit 23. Since the other ions in the mixture have the values e/m greatly different from those of the hydrogen molecular ion $H_2^+$ and the deuterium ion $D^+$, they are separated from both ions by the mass spectrograph unit 22. As a result, only the two kinds of ions $H_2^+$ and $D^+$ are irradiated on the substrate 25 since the particle accelerator unit 23 can not accelerate the ions other than the ions $H_2^+$ and $D^+$.

In the irradiation step, since two atoms of the hydrogen molecular ion $H_2^+$ are bonded each other with a low bonding energy, the hydrogen molecular ion $H_2^+$ is divided into two hydrogen ions $2H^+$ upon colliding against the substrate 25. As a result, the deuterium ions $D^+$ and the hydrogen ions $H^+$ are injected into the substrate 25 at the same time. In general, since the hydrogen ion $H^+$ and the deuterium ion $D^+$ have different ranges each other in silicon, these ions are stopped in the regions at different depths in the silicon substrate even if they are injected by the same acceleration voltage.

By use of the above-described charged particle accelerator, the substrate 25 is irradiated with a mixture of at least two kinds of charged particles having substantially the same value e/m, thereby forming at least two crystal defect regions including a great number of crystal defects.

Figure 5:
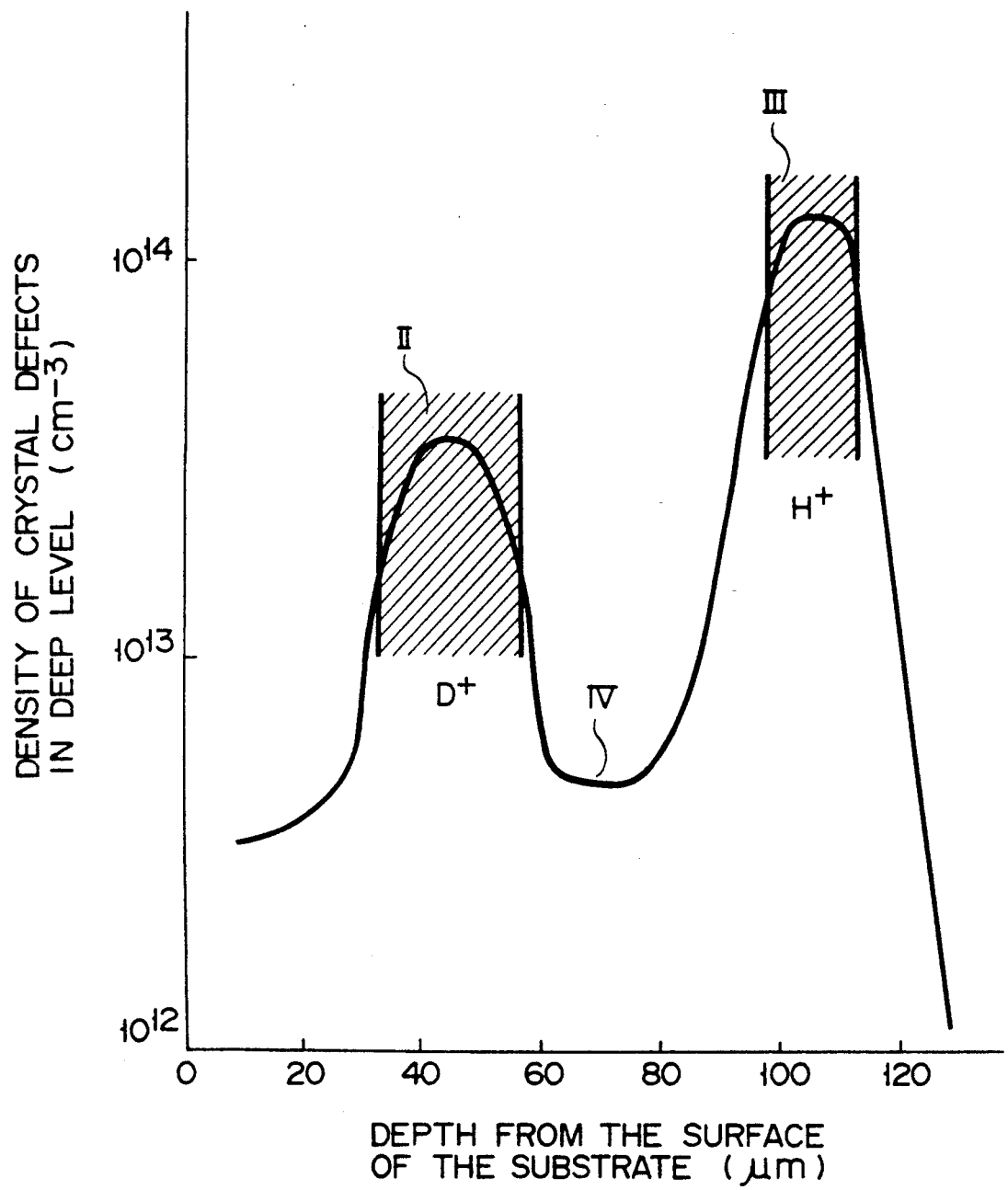
FIG. 5 is a diagram showing a distribution of crystal defect regions formed at a deep level of a silicon semiconductor substrate according to the method of the present invention.

FIG. 5 shows a distribution of crystal defect regions formed at deep levels in the silicon semiconductor substrate according to the method of the present invention. More specifically, FIG. 5 is a profile of crystal defect densities at deep levels (at a level 0.39 eV lower than a conductive band Ec) in a case where the hydrogen molecular ions $H_2^+$ and the deuterium ions $D^+$ are accelerated by the acceleration voltage of 5 MeV in the charged particle accelerator in FIG. 4, and irradiated in the dosage of $1 \times 10^{13} cm^{-2}$ (the sum of the dosage of hydrogen molecular ions $H_2^+$ and deuterium ions $D^+$), on the N-type silicon substrate 25 which has the resistance of 2 $\Omega$cm and the face orientation (100). As shown in FIG. 5, two regions II and III of high crystal defect densities are formed in the substrate. The regions II and III substantially correspond to the charged particle stopping regions. In other words, the region II is a $D^+$ ion stopping region and the region III is an $H_2^+$ ion stopping region. As is also described above, the ranges of the hydrogen ions $H^+$ and the deuterium ions $D^+$ are different in silicon even if they are injected by the same acceleration voltage. Hence, the hydrogen ions $H^+$ pass through the $D^+$ ion stopping region, and stop at the region III. As a result, three kinds of regions which comprises the regions II and III and a region IV intervening therebetween and in which the lifetimes of the carriers are different are formed at the different depths in the semiconductor substrate 25.

The method of the present invention can be applied not only to the diode shown in FIG. 3, but also to various devices, such as a thyristor which requires two or more crystal defect regions to control the lifetime of the carriers. In such a device, the $H_2^+$ ion stopping region III can serve as a trap region for trapping the carriers near the PN junction.

As has been described above, according to the present invention, it is unnecessary to irradiate the protons by different acceleration voltages in the same number of times as that of the crystal defect regions required. Thus, the number of steps of manufacturing the semiconductor device can be decreased and also the manufacturing cost can be reduced as compared to the conventional method and the conventional device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
   introducing a mixture of at least two kinds of charged particles having substantially the same value e/m obtained by dividing the electric charge of an ion by the mass of the ion into a semiconductor substrate simultaneously and from the same surface of said semiconductor substrate; and
   forming at least three regions of different lifetimes of carriers in said semiconductor substrate.

2. A method of manufacturing a semiconductor device according to claim 1, wherein said mixture of said charged particles is injected into said semiconductor substrate by predetermined acceleration voltage and in predetermined dosage, thereby forming said at least three regions with different crystal defect densities at different depths in said semiconductor substrate, said at least three regions of different lifetimes of carrier including two crystal defect regions and one substrate region between said two crystal defect regions in depth direction of said at least three regions.

3. A method of manufacturing a semiconductor device according to claim 1, wherein said mixture of the charged particles is subjected to mass spectrometry by a mass spectrograph, accelerated by a charged particle accelerator, and injected into the semiconductor substrate.

4. A method of manufacturing a semiconductor device according to claim 1, wherein said charged particles include hydrogen molecular ions $H_2^+$ and deuterium ions $D^+$.

* * * * *